(12) United States Patent
Sato et al.

(10) Patent No.: US 11,150,309 B2
(45) Date of Patent: Oct. 19, 2021

(54) DEGRADATION DEGREE ESTIMATION APPARATUS AND POWER SOURCE INCLUDING THE SAME

(71) Applicant: DENSO CORPORATION, Kariya (JP)

(72) Inventors: Yoshinori Sato, Kariya (JP); Shuhei Yoshida, Kariya (JP); Nobuo Yamamoto, Kariya (JP); Yuta Shimonishi, Kariya (JP)

(73) Assignee: DENSO CORPORATION, Kariya (JP)

( * ) Notice: Subject to any disclaimer, the term of this patent is extended or adjusted under 35 U.S.C. 154(b) by 209 days.

(21) Appl. No.: 16/530,640

(22) Filed: Aug. 2, 2019

(65) Prior Publication Data
US 2020/0041576 A1    Feb. 6, 2020

(30) Foreign Application Priority Data
Aug. 2, 2018 (JP) .............................. JP2018-145998

(51) Int. Cl.
| | | |
|---|---|---|
| *G01R 31/392* | (2019.01) | |
| *G01R 31/367* | (2019.01) | |
| *G01R 31/389* | (2019.01) | |
| *H02J 7/00* | (2006.01) | |

(52) U.S. Cl.
CPC ......... *G01R 31/392* (2019.01); *G01R 31/367* (2019.01); *G01R 31/389* (2019.01); *H02J 7/0068* (2013.01)

(58) Field of Classification Search
CPC .. G01R 31/392; G01R 31/367; G01R 31/389; H02J 7/0068
See application file for complete search history.

(56) References Cited

U.S. PATENT DOCUMENTS

| | | | | |
|---|---|---|---|---|
| 2004/0130297 | A1* | 7/2004 | Baeuerlein | G01R 31/389 |
| | | | | 320/137 |
| 2007/0210760 | A1* | 9/2007 | Shimamura | H01M 10/425 |
| | | | | 320/135 |
| 2011/0149454 | A1* | 6/2011 | Shibuya | H01M 10/48 |
| | | | | 361/87 |
| 2012/0109443 | A1 | 5/2012 | Takahashi et al. | |
| 2014/0167702 | A1* | 6/2014 | Sakurai | H02J 7/0029 |
| | | | | 320/134 |
| 2015/0061687 | A1* | 3/2015 | Shim | G01R 31/3835 |
| | | | | 324/426 |

(Continued)

FOREIGN PATENT DOCUMENTS

JP    2013-044598 A    3/2013

*Primary Examiner* — Daniel R Miller
(74) *Attorney, Agent, or Firm* — Oliff PLC

(57) ABSTRACT

An apparatus for estimating a degradation degree of a secondary battery includes a pulse current applying unit that applies a pulse current; a voltage acquiring unit that acquires a charge voltage and a discharge voltage which are produced at the secondary battery by applying the pulse current; a relative value calculation unit that calculates a relative value between the charge voltage and the discharge voltage; a correlation storage unit that stores a correlation between a relative value between the charge voltage and the discharge voltage, and a degradation degree of the secondary battery; and a degradation degree estimation unit that obtains a degradation degree of the secondary battery from the correlation storage unit, based on the relative value calculated by the relative value calculation unit.

9 Claims, 5 Drawing Sheets

(56) References Cited

U.S. PATENT DOCUMENTS

| | | | |
|---|---|---|---|
| 2015/0140374 A1* | 5/2015 | Yamamoto | H01M 10/425 |
| | | | 429/61 |
| 2016/0079788 A1* | 3/2016 | Amasaki | G01R 31/3842 |
| | | | 320/136 |
| 2016/0178706 A1* | 6/2016 | Liu | G01R 31/392 |
| | | | 702/63 |

* cited by examiner

| RELATIVE VALUE B/A | a | b | c | d | e | ... | n |
|---|---|---|---|---|---|---|---|
| TABLE Rn | R1 | R2 | R3 | R4 | R5 | ... | Rn |

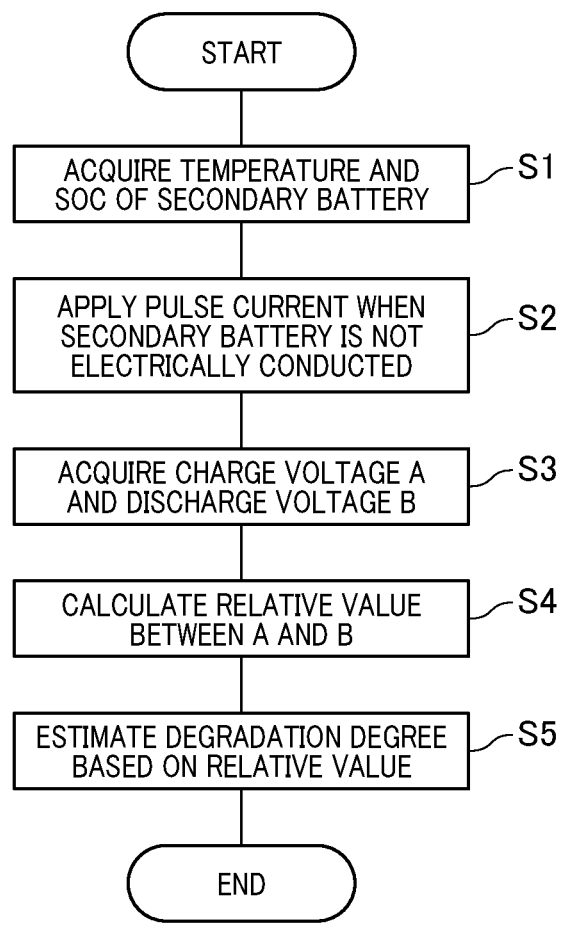

DEGRADATION DEGREE ESTIMATION APPARATUS AND POWER SOURCE INCLUDING THE SAME

CROSS-REFERENCE TO RELATED APPLICATION

This application is based on and claims the benefit of priority from earlier Japanese Patent Application No. 2018-145998 filed Aug. 2, 2018, the description of which is incorporated herein by reference.

BACKGROUND

Technical Field

The present disclosure relates to a degradation degree estimation apparatus and a power source including the same.

Description of the Related Art

Conventionally, various apparatuses have been evaluated for estimating the degradation degree of secondary batteries. An example of the apparatuses is configured to evaluate the degradation degree of the secondary battery based on change rate of parameters of the secondary battery including a DC resistance and a diffusion coefficient.

SUMMARY

The present disclosure has been achieved in light of the above-mentioned circumstances and provides a degradation degree estimation apparatus for a secondary battery. The apparatus includes a pulse current applying unit; a voltage acquiring unit; a relative value calculation unit; a correlation storage unit; and a degradation degree estimation unit that obtains a degradation degree of the secondary battery based on data obtained from the above-mentioned units.

BRIEF DESCRIPTION OF THE DRAWINGS

In the accompanying drawings:

FIG. 4 is a flowchart showing a detailed control of the degradation degree estimation apparatus according to the first embodiment.

DETAILED DESCRIPTION OF THE PREFERRED EMBODIMENTS

Figure 1:
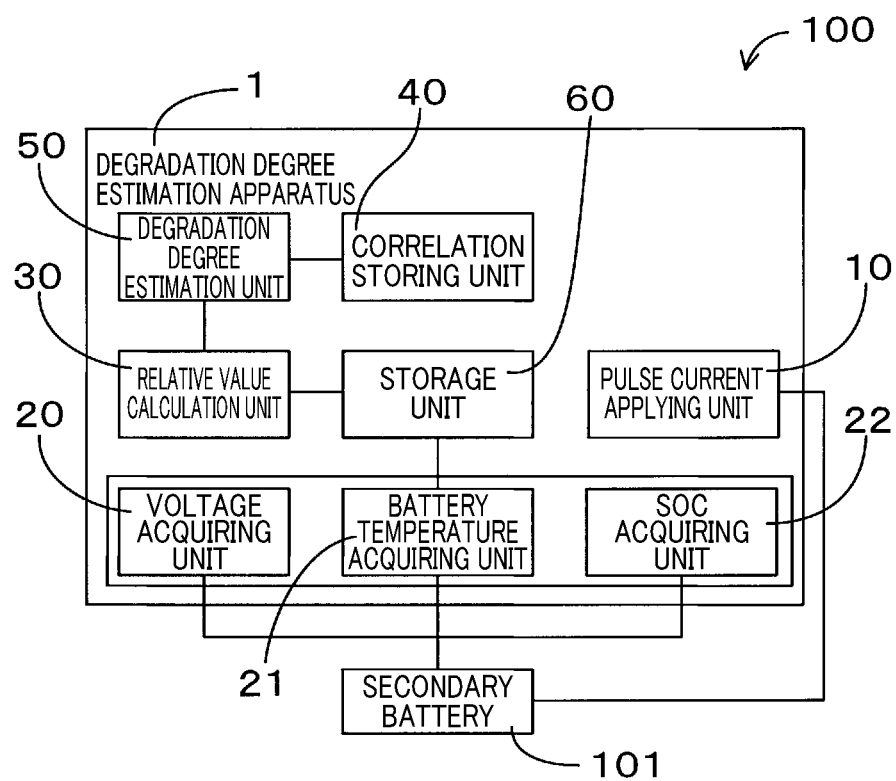
FIG. 1 is a block diagram showing an overall configuration of a degradation estimation apparatus and a power source according to a first embodiment of the present disclosure.

According to the above-mentioned conventional type of apparatus, for example, Japanese Patent Application Laid-Open Publication Number 2013-44598 discloses a configuration that accurately evaluates, during the operation state of a secondary battery, the degradation degree of the secondary battery based on a parameter change rate of a DC resistance and a diffusion coefficient which are learned for each learning region determined in accordance with a combination of the state of charge (SOC) and the battery temperature of the secondary battery.

However, according to the configuration disclosed by the above-mentioned patent literature, the parameter change rate of the DC resistance and the diffusion coefficient are required to calculate when evaluating the degradation degree of the secondary battery. Hence, processing load for the calculation is high, and an extended period may be required to obtain the evaluation result. In this respect, further improvement is required for accurately evaluating the degradation degree.

A first aspect of the present disclosure is an apparatus for estimating a degradation degree of a secondary battery. The apparatus includes a pulse current applying unit that applies a pulse current composed of at least a pair of pulse signals having mutually different polarities to the secondary battery; a voltage acquiring unit that acquires a charge voltage and a discharge voltage which are produced at the secondary battery by applying the pulse current; a relative value calculation unit that calculates a relative value between the charge voltage and the discharge voltage which are acquired by the voltage acquiring unit; a correlation storage unit that stores in advance, a correlation between a relative value between the charge voltage and the discharge voltage, and a degradation degree of the secondary battery; and a degradation degree estimation unit that obtains a degradation degree of the secondary battery from the correlation storage unit, based on the relative value calculated by the relative value calculation unit.

According to the above-described apparatus, when estimating the degradation degree of the secondary battery, the apparatus applies a pulse current composed of at least a pair of pulse signals having mutually different polarities to the secondary battery. Then, the apparatus acquires a charge voltage and a discharge voltage which are produced at the secondary battery, and calculates a relative value between the charge voltage and the discharge voltage. Thereafter, the apparatus obtains a degradation degree of the secondary battery from a correlation between a relative value between the charge voltage and the discharge voltage, and a degradation degree of the secondary battery which is stored in advance in a correlation storage unit, based on the calculated relative value. Since the relative value is based on the charge voltage and the discharge voltage produced when the pulse current composed of at least a pair of pulse signals is applied, the processing load can be reduced and the required time for acquiring the estimation result can be shortened. The degree of degradation of the secondary battery is significantly affected by a degradation of the positive electrode of the secondary battery. In this respect, the inventors of the present application have found out a fact that the degradation of the positive electrode influences a change in the relative value between the charge voltage and the discharge voltage. Hence, the above-described apparatus is able to accurately estimate the degradation degree of the secondary battery based on a change in the relative value between the charge voltage and the discharge voltage.

As described, the present disclosure provides a degradation degree estimation apparatus capable of reducing a processing load required for estimating the degree of the secondary battery and shortening the time required for estimating the same, and having better estimating accuracy.

First Embodiment

With reference to FIGS. 1 to 4, a first embodiment of a degradation degree estimation apparatus will be described.

A degradation degree estimation apparatus 1 of the present embodiment is configured to estimate a degree of degradation of a secondary battery 101. As shown in FIG. 1, the degradation degree estimation apparatus 1 is provided with a pulse current applying unit 10, a voltage acquiring unit 20, a relative value calculation unit 30, a correlation storage unit 40, and a degradation degree estimation unit 50. As shown in (a) of FIG. 2, the pulse current applying unit 10 applies a pulse current 11 composed of at least a pair of pulse signals having mutually different polarities to the secondary battery 101 shown in FIG. 1. The voltage acquiring unit 20 acquires a charge voltage A and a discharge voltage B shown in (b) of FIG. 2 which are produced at the secondary battery by applying the pulse current 11. The relative value calculation unit 30 calculates the relative value B/A between the charge voltage A and the discharge voltage B acquired by the voltage acquiring unit 20. The correlation storage unit 40 stores in advance a correlation between a degradation degree of the secondary battery 101 and a relative value between the charge voltage A and the discharge voltage B. The degradation estimation unit 50 obtains the degradation degree of the secondary battery 101 from the correlation storage unit 40, based on the relative value B/A calculated by the relative value calculation unit 30.

Figure 2:
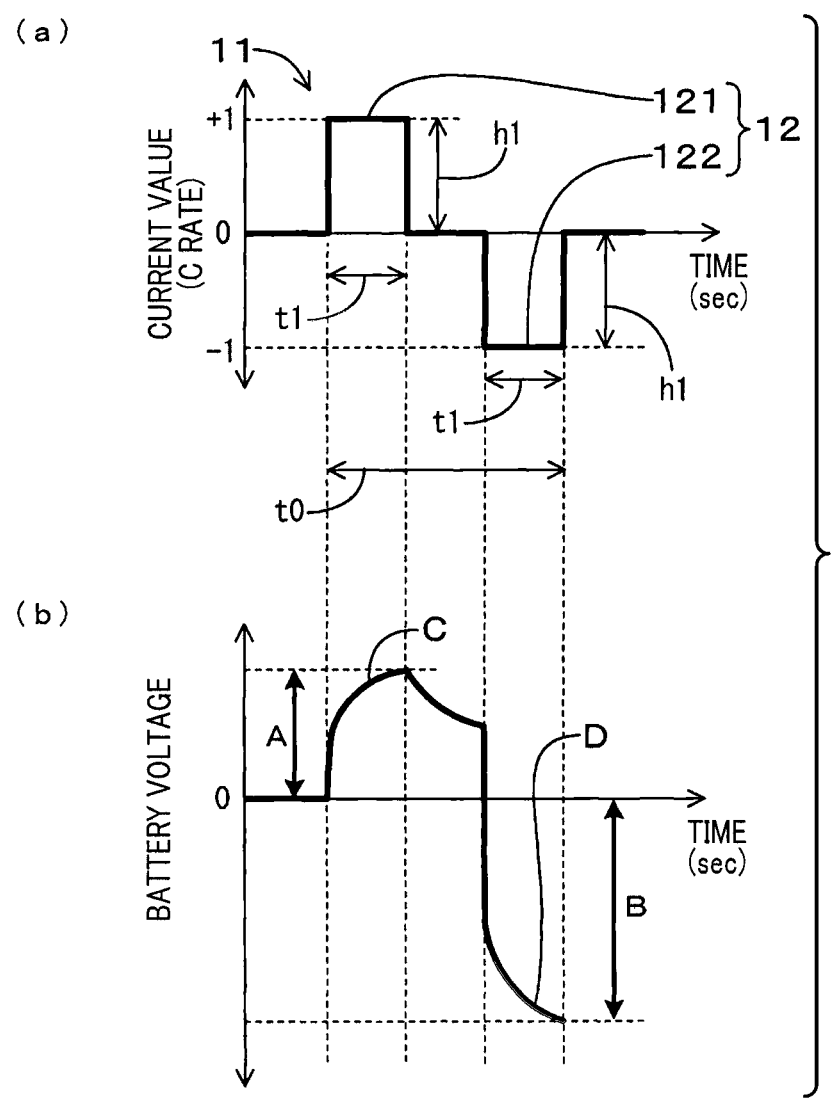
FIG. 2 is a set of timing diagrams showing waveforms in which (a) illustrates a change in a pulse current, and (b) shows a change in a battery voltage.

Hereinafter, the degradation degree estimation apparatus 1 according to the present embodiment will be described in detail. The pulse current applying unit 10 shown in FIG. 1 is configured as a current generator capable of outputting a pulse current shown in (a) of FIG. 2, and applies the pulse current 11 to the secondary battery 101. The pulse current 11 is composed of a pair of pulse signal 12 having mutually different polarities shown (a) of FIG. 2. The pair of pulse signal 12 consists of a positive pulse signal 121 and a negative pulse signal 122, each having a rectangular wave. The pulse width t1 of the positive pulse signal 121 and the negative pulse signal 122 is not limited to a specific value, but may preferably be 0.1 to 5.0 second. According to the present embodiment, the pulse width t1 is set to be 1.0 second. Also, the pulse amplitude h1 of the positive and negative pulse signals is not limited to a specific value, but may preferably be ±0.3 to 3.0 C, where C refers to a capacity rate (C-rate) of the secondary battery 101. According to the present embodiment, the pulse amplitude h1 is set to be ±1 C. For the pulse current 11, pulse signals having mutually different polarities may preferably be alternately outputted. Thus, the secondary battery 101 can be prevented from being deviated toward either charging of discharging operation, when estimating the degradation degree. Further, the application time t0 of the pulse current 11 shown in (a) of FIG. 2 is not limited to a specific value, but may preferably be 0.1 to 9.9 second. According to the present embodiment, the application time t0 is set to be 3.0 second.

The pulse current 11 may include a pair of pulse signal 12 or a plurality of pulse signals 12. In the case where only one pair of pulse signals 2 are included in the pulse current 11, conduction time of the secondary battery 101 can be shortened so that a time required to estimate the degradation degree can be shortened. Moreover, power consumption can be reduced and degradation of the secondary battery 101 can be suppressed. ON the other hand, when the pulse current 11 includes a plurality of pulse signals 12, influences from measurement error can be suppressed. Note that the pulse current 11 includes only one pair of pulse signal as shown in (a) of FIG. 2 according to the present embodiment.

As shown in (a) of FIG. 2, the pair of pulse signals 12 consist of a positive pulse signal 121 and a negative pulse signal 122. the current of the positive pulse signal 121 is applied to the secondary battery 101 to cause a charging reaction in the secondary battery 101, and the current of the negative pulse signal 122 is applied to the secondary battery 101 to cause a discharge reaction in the secondary battery 101. The amount of the positive and negative pulse signals 121 and 122 are not specifically limited. However, the absolute values and the pulse widths may preferably be the same between the positive and negative pulse signals 121 and 122. Since an amount of charge and an amount of discharge which are produced at the secondary battery 101 due to application of the pulse current 11 are the same, waste and surplus of the input power can be avoided.

As shown in (a) of FIG. 2, in the pulse current 11, it is preferable to apply a negative pulse signal 122 subsequent to the positive pulse signal 121 to the secondary battery 101. In this case, the charge reaction at the positive electrode of the secondary battery 101 is more stable than the discharge reaction thereof. Hence, the charge reaction precedes the discharge reaction, whereby discharge reaction occurs stably so that an accuracy for estimating the degradation degree can be improved.

According to the present embodiment, the pulse current applying unit 10 is configured to apply the above-described pulse current to the secondary battery 101 in a state where the secondary battery is not operated. The state where the secondary battery is not electrically conducted includes, for example, a state where an apparatus provided with the secondary battery 101 as a power source is not operating, or a state where the apparatus provided with the secondary battery 101 is operating, but the secondary battery 101 as an estimation object of degradation degree is not supplied with power and not outputting power, thus the secondary battery 101 is not substantially operated.

In the case where the pulse current applying unit 10 shown in FIG. 1 applies a pulse current 11 shown in (a) of FIG. 2 to the secondary battery 101, as shown in (b) of FIG. 2, the positive pulse signal 121 causes a charge reaction in the secondary battery 101 such that the battery voltage is increased as indicated a symbol C, and the negative pulse signal 122 causes a discharge reaction in the secondary battery 101 such that the battery voltage is decreased as indicated a symbol D.

The battery voltage during the charge reaction and the discharge reaction is acquired by the voltage acquiring unit 20 shown in FIG. 1. The voltage acquiring unit 20 is configured of a known voltmeter. The voltage acquiring unit 20 acquires a charge voltage A and a discharge voltage B at the secondary batter 101 which are produced by applying the pulse current 11. According to the present embodiment, as shown in (b) of FIG. 2, the voltage acquiring unit 20 acquires the maximum voltage during the charge operation as the charge voltage A, and acquires the minimum voltage during the discharge operation as the discharge voltage B. The respective charge voltage A and discharge voltage B acquired by the voltage acquiring unit 20 are separately stored into a storage unit 60 constituted of a rewritable non-volatile memory.

The relative value calculation unit 30 is configured of a calculation unit capable of executing a predetermined program which is not shown, and calculates a relative value between the charge voltage A and the discharge voltage B which are acquired by the voltage acquiring unit 20, by executing the predetermined program. According to the present embodiment, the relative value calculation unit 30 refers to the charge voltage A and the discharge voltage B which are separately stored in the storage unit 60, and calculates a ratio of B to A, B/A as the relative value. The relative value is not limited to this ratio, but may be any value as long as a mutual relationship can be determined. In the case where degradation of the secondary battery 101 is advanced, reaction resistance of the charging and discharging increases so that both of the charge voltage A and the discharge voltage B increase. However, since an increase ratio of the reaction resistance at the positive electrode of the secondary battery 101 in the discharge reaction is higher than that of the charge reaction, the discharge voltage B significantly increases due to the degradation comparted to the charge voltage A. As a result, the ratio B/A is likely to increase due to the degradation. Note that the relative value calculated by the relation calculation unit 30 is stored into the storage unit 60.

Figures 3A, 3B:
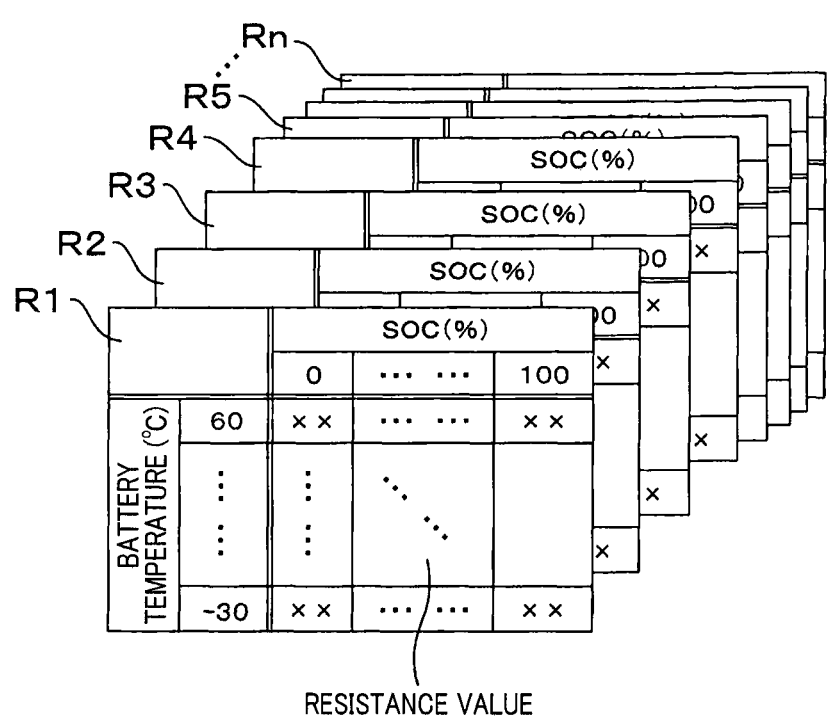
FIGS. 3A and 3B are conceptual diagrams in which a correlation stored in a correlation storage unit according to the first embodiment is shown.
Figure 5:
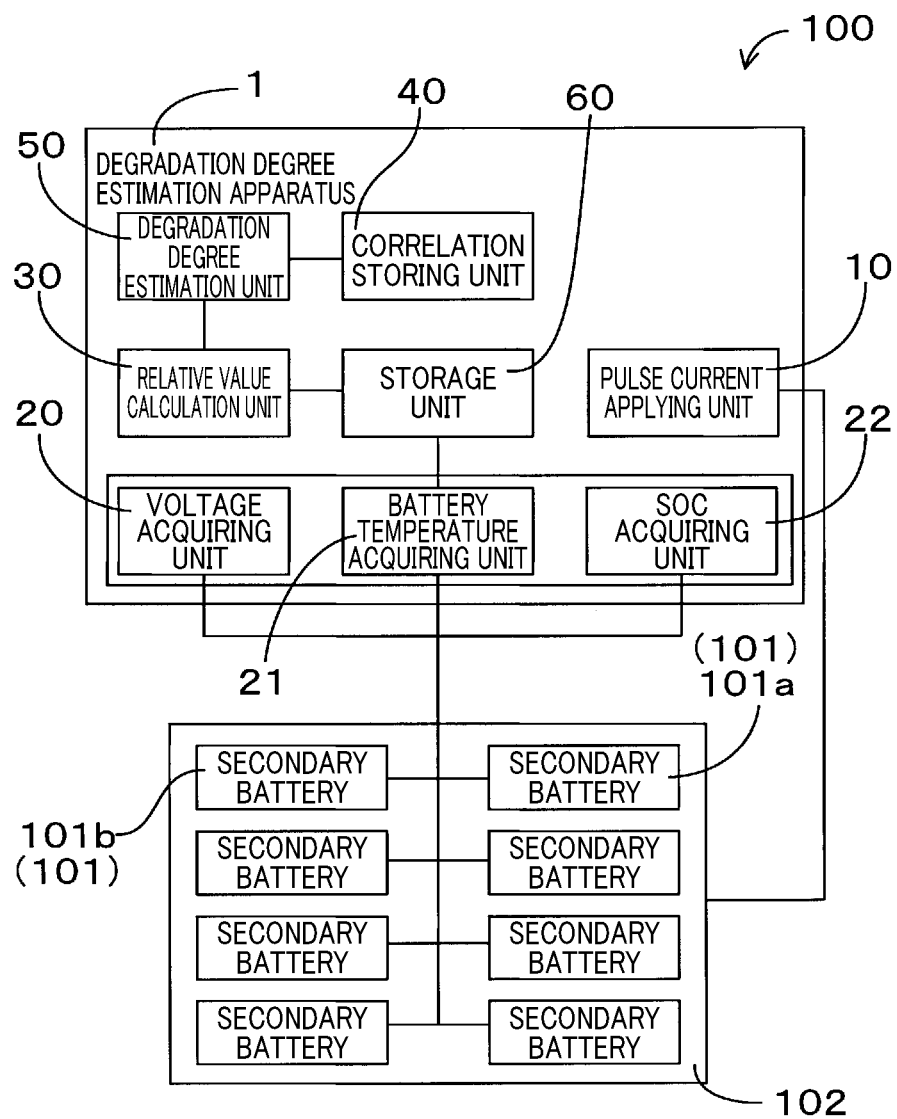
FIG. 5 is a block diagram showing an overall configuration of the degradation estimation apparatus and the power source.

The correlation storage unit 40 shown in FIG. 1 is constituted of a rewritable non-volatile memory, and stores in advance, the correlation between the relative value B/A between the charge voltage A and the discharge voltage B, and the degradation degree of the secondary battery 101. According to the present embodiment, the correlation between the relative value B/A and the resistance value of the secondary battery as the degradation degree of the secondary battery 101 is stored in advance in the correlation storage unit 40. The correlation between the relationship between value B/A and the resistance value may be a map, a table, an equation, and a theoretical model. According to the present embodiment, the correlation is composed of a plurality of tables R1, R2, R3, R4, R5 and Rn, each having the temperature and the state of charge (i.e. SOC) of the secondary battery 101 shown in FIG. 3A, and a relationship table between the relative value B/A and the table Rn shown in (b) of FIG. 2. The plurality of tables shown in FIG. 3A are derived from data obtained through an acceleration test applied to a reference battery.

According to the present embodiment, as shown in FIG. 1, the degradation degree estimation apparatus includes a battery temperature acquiring unit 21, a SOC acquiring unit 22. The battery temperature acquiring unit 21 is constituted of a temperature sensor and acquires the temperature of the secondary battery 101. The SOC acquiring unit 22 is constituted of a calculation unit that calculates the SOC based on the current value and the voltage value, and acquires the SOC of the secondary battery 101. The acquisition of the SOC can be achieved by using a publicly known method. The acquired value of the battery temperature acquiring unit 21 and the SOC acquiring unit 22 are separately stored into the storage unit 60.

The degradation degree estimation apparatus 50 shown in FIG. 1 is configured of a calculation unit capable of executing a predetermined program which is not shown and estimates, based on the relative value B/A stored in the storage unit 60, the degradation degree of the secondary battery 101 by executing the predetermined program. According to the present embodiment, degradation degree estimation apparatus 50 refers to the relative value B/A stored in the storage unit 60, derives a table Rn related to the relative value B/A from the correlation storage unit 40, reads the derived table Rn and acquires the resistance value of the secondary battery 101 based on the battery temperature and the SOC stored in the storage unit 60. Thus, the resistance value is updated to the resistance value in the table Rn corresponding to the current battery temperature and the SOC, whereby the degradation degree of the secondary battery 101 is estimated from the state before being updated.

According to the present embodiment, the secondary battery 101 which is an object for estimation is lithium ion battery. The material of the electrodes of the secondary battery 101 is not limited to any specific material, but may be made of publicly known material such as lithium manganese oxide $LiM_2O_4$ or lithium nickel manganese cobalt oxide $LiNiMnCoO_2$ for the positive electrode, and graphite or lithium titanate $Li_4Ti_5O_{12}$ for the negative electrode.

Next, with reference to FIG. 4, operation mode of the degradation degree estimation apparatus 1 according to the present embodiment will be described. As shown in FIG. 4, at first step S1, the process acquires the temperature and the SOC of the secondary battery 101. The temperature of the secondary battery 101 is acquired by the battery temperature acquiring unit 21. Also, the SOC is acquired by the SOC acquiring unit 22. The acquired value is separately stored into the storage unit 60.

Next, at second step S2 shown in FIG. 4, a pulse current 11 is applied to the secondary battery 101. The pulse current 11 is applied by the pulse current applying unit 10 shown in FIG. 1. According to the present embodiment, the pulse current 11 is applied to the secondary battery 101 under a condition where the secondary battery 101 is not operated.

Then, at third step S3 shown in FIG. 4, the process acquires the charge voltage A and the discharge voltage B produced at the secondary battery 101 by applying the pulse current 11. The charge voltage A and the discharge voltage B are acquired by the voltage acquiring unit 20 shown in FIG. 1. The acquired charge voltage A and the discharge voltage B are separately stored into the storage unit 60. According to the present embodiment, the maximum charge voltage and the minimum discharge voltage are acquired as the charge voltage A and the discharge voltage B, respectively.

Thereafter, at fourth step S4 shown in FIG. 4, the process refers to the charge voltage A and the discharge voltage B stored in the storage unit 60 so as to calculate the relative value therebetween. The calculation of the relative value is accomplished by the relative value calculation unit 30 shown in FIG. 1. According to the present embodiment, B/A is calculated as the relative value. The calculated relative value B/A is stored into the storage unit 60.

At fifth step shown in FIG. 4, the process estimates the degradation degree of the secondary battery 101 based on the relative value B/A calculated by the relative value calculation unit 30. The estimation of the degradation degree is performed by the degradation degree estimation unit 50. According to the present embodiment, a table Rn related to the calculated relative value B/A based on the correlation between the relative value B/A and the table Rn is derived and a resistance corresponding to the battery temperature and the SOC acquired from the derived table Rn at the first step S1 is calculated, thereby estimating the degradation degree of the secondary battery 101.

Next, effects and advantages of the degradation degree estimation apparatus 1 according to the present embodiment will be described in detail. In the degradation degree estimation apparatus 1 according to the present embodiment, a pulse current 11 composed of at least a pair of pulse signals 12 having mutually different polarities is applied to the secondary battery 101 to estimate the degradation degree of the secondary battery 101. Then, the charge voltage A and the discharge voltage B produced at the secondary battery 101 is acquired to calculate the relative value B/A between the charge voltage A and the discharge voltage B. Thereafter, the degradation degree of the secondary battery 101 is derived in accordance with the correlation between the relative value B/A stored in the correlation storage unit 40 and the degradation degree of the secondary battery 101, based on the calculated relative value B/A. Since the relative value B/A is determined based on the charge voltage A and the discharge voltage B produced when the pulse current 11 composed of at least a pair of pulse signals 12, a processing load for the estimation can be reduced and the required time for acquiring the estimation result can be shortened. The degree of degradation of the secondary battery 101 is significantly affected by a degradation of the positive electrode of the secondary battery 101. In this respect, the inventors of the present application have found out a fact that the degradation of the positive electrode influences a change in the relative value B/A between the charge voltage A and the discharge voltage B. Hence, the degradation degree estimation apparatus 1 is able to accurately estimate the degradation degree of the secondary battery 101 based on a change in the relative value B/A between the charge voltage A and the discharge voltage B.

Further, according to the present embodiment, the relative value calculation unit 30 calculates, as the relative value B/A, a relative value B/A between the maximum voltage in the charge voltage A and the minimum voltage in the discharge voltage B acquired by the voltage acquiring unit 20. Thus, since the voltage value to be acquired becomes relatively high, the S/N ratio can be high so that the estimation accuracy of the degradation degree can be improved.

According to the present embodiment, the pulse current applying unit 10 is configured to apply pulse current in a state where the secondary battery 101 is not electrically conducted. Thus, the state of the secondary battery 101 immediately before estimating the degradation degree can be stable, and the degradation degree of the secondary battery 101 can be accurately estimated. Further, the application period of the pulse current 11 can be shorter so that the power consumption can be reduced. Furthermore, since a required amount of calculation is small, the processing load can be reduced.

Also, according to the present embodiment, the current value of the pulse current 11 applied to the secondary battery 101 by the pulse current applying unit 10 is constant among pulses having the same polarity. Thus, variations in the charge voltage A and the discharge voltage B which are acquired by the voltage acquiring unit 20 are reduced. Hence, the estimation accuracy of the degradation degree can be further improved.

Also, according to the present embodiment, the application time of the pulse current 11 applied to the secondary battery 11 by the pulse current applying unit 10 ranges from 0.1 to 9.9 seconds. Thus, the degradation degree can be estimated accurately in a short period of time. The convenience will be improved.

According to the present embodiment, the pulse width t1 of the pulse current 11 applied to the secondary battery 101 by the pulse current applying unit 10 ranges 0.1 to 5.0 sec. Also, the amplitude h1 of the pulse current ranges ±0.3 to 3.0 C. The application time of the pulse current 11 can be relatively small and an amount of power to be applied can be relatively large. Hence, the degradation degree can be estimated accurately in the short period of time.

According to the present embodiment, the correlation stored in the correlation storage unit 40 refers to a correlation between the relative value B/A and the resistance of the secondary battery 101 as the degradation degree of the secondary battery 101. Thus, the degradation degree of the secondary battery 101 can be estimated based on a change in the resistance of the secondary battery 101.

Also, according to the present embodiment, a power source unit 100 is utilized, which is provided with the degradation degree estimation apparatus 1 and the secondary battery 101 including a lithium ion battery. Thus, the power source unit 100 is able to accurately estimate the degradation degree of the secondary battery 101. Therefore, the power source unit 100 according to the present disclosure has high reliability.

As described, according to the present embodiment, a degradation estimation degree 1 can be provided in which the processing load required for estimating the degradation degree of the secondary battery 101 is reduced, a required time for estimating the degradation degree can be shortened, and the degradation degree of the secondary battery 101 can be accurately estimated.

Second Embodiment

According to the present embodiment, instead of using the secondary battery 101 of the first embodiment, a battery assembly 102 composed of a plurality of secondary batteries 101 including first secondary batteries 101a and second secondary batteries 101b. In the battery assembly 102, the secondary batteries 101 are connected in parallel. The plurality of secondary batteries 101 are configured such that the pulse current 11 is transmittable therethrough. According to the present embodiment, the pulse current 11 can be transmitted between the first secondary batteries 101a and the second secondary batteries 101b. Other configurations in the present embodiment are the same as those in the first embodiment, and the same reference numbers are applied to the other configurations and the explanation thereof will be omitted.

According to the present embodiment, the degradation degree of the secondary battery 101 included in the battery assembly 102 is estimated similarly to the first embodiment, whereby the degradation degree of the battery assembly 102 can be estimated. It should be noted that the secondary battery 101 to be estimated in the battery assembly 102 can be selected from one or more secondary batteries included in the battery assembly 102.

According to the present embodiment, the battery assembly 102 is configured such that the pulse current 11 can be transmitted between the first secondary batteries 101a and the second secondary batteries 101b, whereby the degradation degree can be estimated by applying the pulse current 11 in the battery assembly 102. Also in the present embodiment, similar effects and advantages can be obtained.

The present disclosure is not limited to the above-described embodiments, but can be modified without departing from the sprits of the present disclosure.

What is claimed is:

1. An apparatus for estimating a degradation degree of a secondary battery, the apparatus comprising:
    a pulse current applying unit that applies a pulse current composed of at least a pair of pulse signals having mutually different polarities to the secondary battery;
    a voltage acquiring unit that acquires a maximum value A of a charge voltage and a minimum value B of a discharge voltage which are produced at the secondary battery by applying the pulse current;
    a relative value calculation unit that calculates a relative value between the maximum value A of the charge voltage and the minimum value B of the discharge voltage which are acquired by the voltage acquiring unit, the relative value being a ratio B/A;
    a correlation storage unit that stores in advance, a correlation between a degradation degree of the secondary battery and the relative value; and a degradation degree estimation unit that obtains the degradation degree of the secondary battery from the correlation storage unit, based on the relative value B/A calculated by the relative value calculation unit.

2. The apparatus according to claim 1, wherein
the pulse current applying unit is configured to apply the pulse current to the secondary battery in a state where the secondary battery is not operated.

3. The apparatus according to claim 1, wherein
a current value of the pulse current applied to the secondary battery by the pulse current applying unit is constant among pulses having the same polarity.

4. The apparatus according to claim 1, wherein
an application time of the pulse current applied to the secondary battery by the pulse current applying unit ranges from 0.1 to 9.9 seconds.

5. The apparatus according to claim 1, wherein
a pulse width of the pulse current applied to the secondary battery by the pulse current applying unit ranges from 0.1 to 5.0 sec; and
an amplitude of the pulse current ranges from ±0.3 to 3.0 C, where C refers to a capacity rate of the secondary battery.

6. The apparatus according to claim 1, wherein
the correlation stored in the correlation storage unit is a correlation between the relative value and a resistance of the secondary battery as the degradation degree of the secondary battery.

7. A power source comprising:
a secondary battery that includes a lithium ion battery; and
an apparatus for estimating a degradation degree of the secondary battery, the apparatus including:
a pulse current applying unit that applies a pulse current composed of at least a pair of pulse signals having mutually different polarities to the secondary battery;
a voltage acquiring unit that acquires a maximum value A of a charge voltage and a minimum value B of a discharge voltage which are produced at the secondary battery by applying the pulse current;
a relative value calculation unit that calculates a relative value between the maximum value A of the charge voltage and the minimum value B of the discharge voltage which are acquired by the voltage acquiring unit, the relative value being a ratio B/A;
a correlation storage unit that stores in advance, a correlation between a degradation degree of the secondary battery and the relative value; and
a degradation degree estimation unit that obtains the degradation degree of the secondary battery from the correlation storage unit, based on the relative value B/A calculated by the relative value calculation unit.

8. The power source according to claim 7, wherein
the secondary battery is provided in a plural number to constitute a battery assembly.

9. The power source according to claim 8, wherein
the battery assembly includes the plurality of secondary batteries configured such that the pulse current is transmittable therethrough.

* * * * *